United States Patent
Farber et al.

(10) Patent No.: US 9,054,158 B2
(45) Date of Patent: Jun. 9, 2015

(54) METHOD OF FORMING A METAL CONTACT OPENING WITH A WIDTH THAT IS SMALLER THAN THE MINIMUM FEATURE SIZE OF A PHOTOLITHOGRAPHICALLY-DEFINED OPENING

(71) Applicant: Texas Instruments Incorporated, Dallas, TX (US)

(72) Inventors: David Gerald Farber, Plano, TX (US); Tom Lii, Plano, TX (US); Steve Lytle, McKinney, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 38 days.

(21) Appl. No.: 13/762,529

(22) Filed: Feb. 8, 2013

(65) Prior Publication Data
US 2014/0227877 A1     Aug. 14, 2014

(51) Int. Cl.
*H01L 21/00*     (2006.01)
*H01L 21/768*     (2006.01)

(52) U.S. Cl.
CPC .............................. *H01L 21/76804* (2013.01)

(58) Field of Classification Search
CPC .................................................. H01L 21/76804
USPC .................................................. 438/301–305
See application file for complete search history.

(56) References Cited

U.S. PATENT DOCUMENTS 7,196,003 B2 *    3/2007    Iba ................................ 438/622

* cited by examiner

*Primary Examiner* — Richard Booth
(74) *Attorney, Agent, or Firm* — Jacqueline J. Garner; Frank Cimino

(57) ABSTRACT

The width of a metal contact opening is formed to be smaller than the minimum feature size of a photolithographically-defined opening. The method forms the metal contact opening by first etching the fourth layer of a multilayered hard mask structure to have a number of trenches that expose the third layer of the multilayered hard mask structure. Following this, the third, second, and first layers of the multilayered hard mask structure are selectively etched to expose uncovered regions on the top surface of an isolation layer that touches and lies over a source region and a drain region. The uncovered regions on the top surface of the isolation layer are then etched to form the metal contact openings.

20 Claims, 21 Drawing Sheets

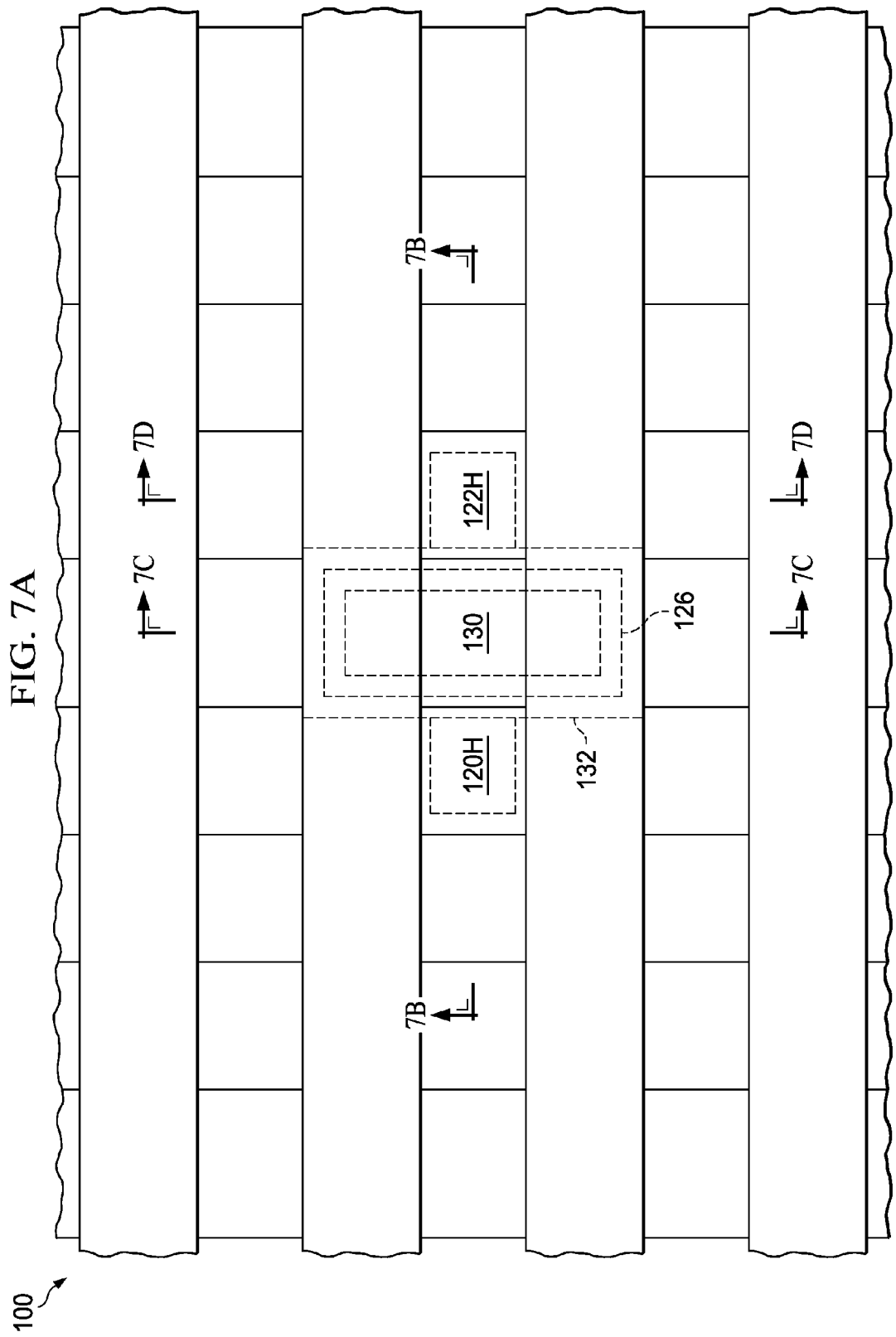

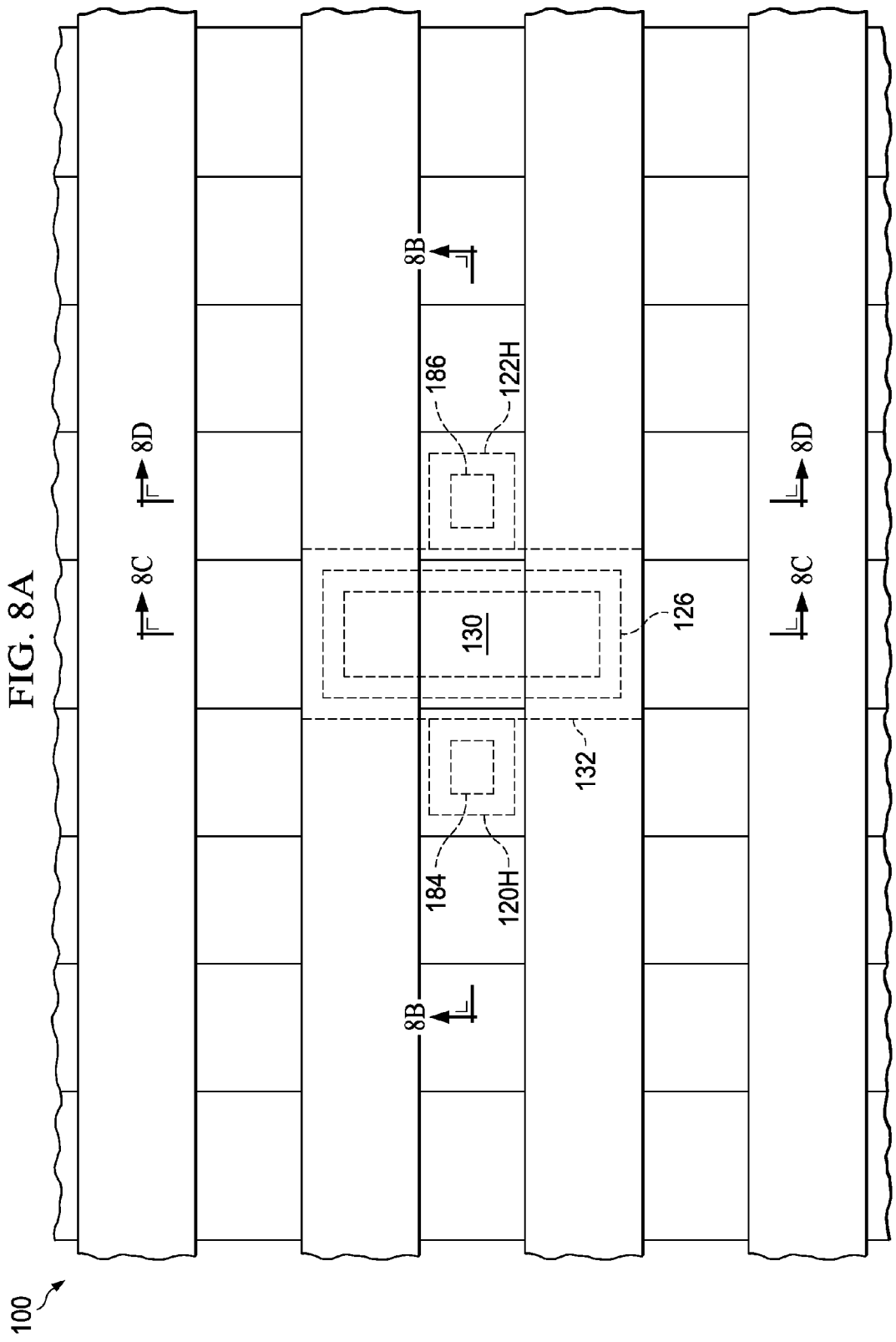

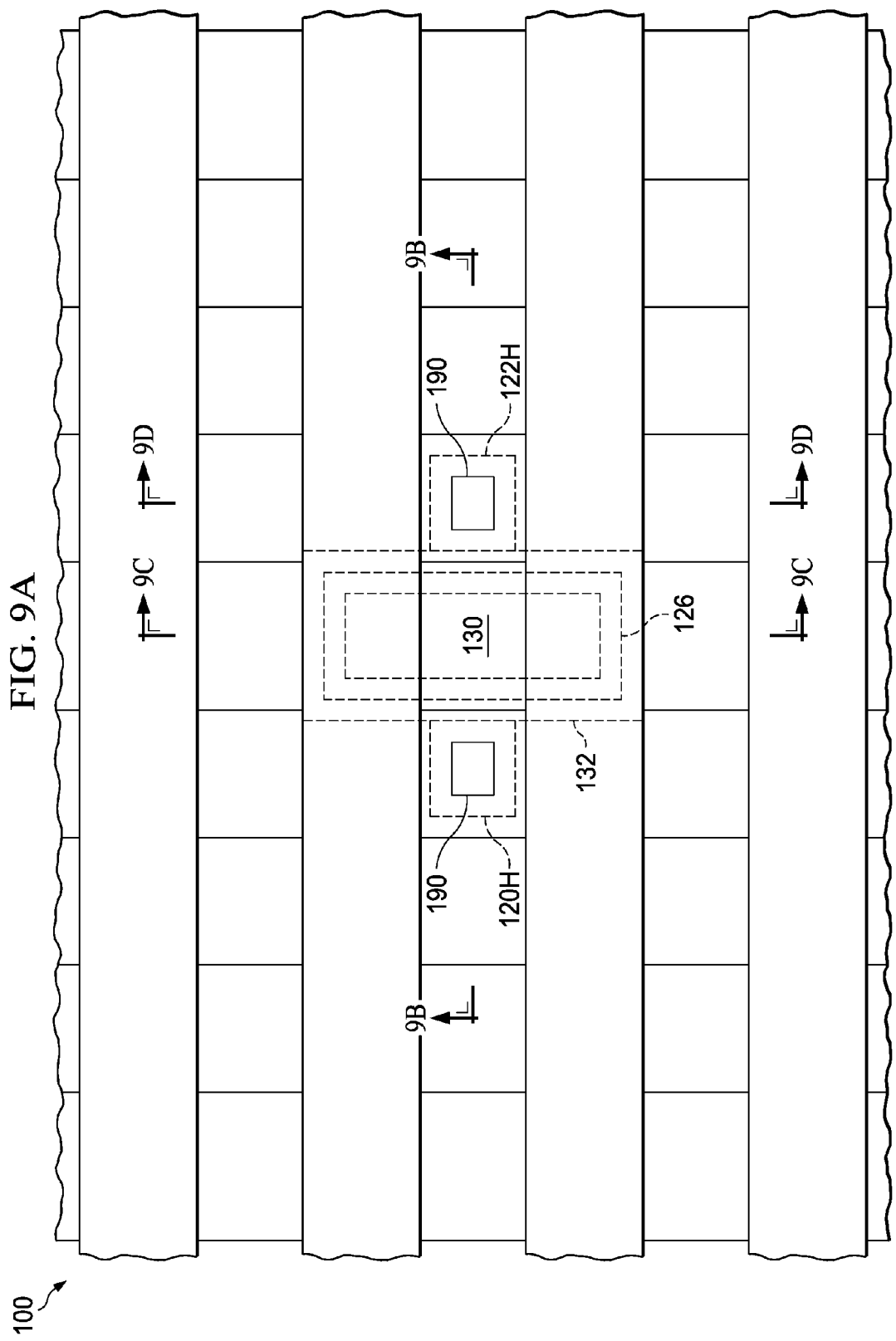

METHOD OF FORMING A METAL CONTACT OPENING WITH A WIDTH THAT IS SMALLER THAN THE MINIMUM FEATURE SIZE OF A PHOTOLITHOGRAPHICALLY-DEFINED OPENING

BACKGROUND OF THE INVENTION

1. Field of the Invention

The present invention relates to a method of forming a metal contact opening and, more particularly, to a method of forming a metal contact opening with a width that is smaller than the minimum feature size of a photolithographically-defined opening.

2. Description of the Related Art

A metal oxide semiconductor (MOS) transistor is a well-known semiconductor device which can be implemented as either an n-channel (NMOS) device or a p-channel (PMOS) device. A MOS transistor has spaced-apart source and drain regions, which are separated by a channel, and a gate that lies over the channel. The gate is insulated from the channel by a gate dielectric layer. A metal-gate MOS transistor is a type of MOS transistor that utilizes a metal gate and a high-k gate dielectric layer.

Metal-gate MOS transistors are connected to a metal interconnect structure that electrically connects the MOS transistors together to form an electrical circuit. The metal interconnect structure includes layers of metal traces that are electrically isolated from each other by layers of isolation material, and metal vias that extend through the layers of isolation material to electrically connect adjacent layers of metal traces.

The metal interconnect structure also includes metal contacts that extend through the bottom layer of isolation material to make electrical connections to the source and drain regions of the MOS transistors. The metal contacts are formed in metal contact openings that extend through the bottom layer of isolation material to expose the source and drain regions.

Conventionally, the metal contact openings are fabricated by forming a pattered photoresist layer on the bottom isolation layer, which touches and lies over the source and drain regions. Once the patterned photoresist layer has been formed, the bottom isolation layer is etched until the source and drain regions have been exposed.

The etch forms source metal contact openings that expose the source regions, and drain metal contact openings that expose the drain regions. The patterned photoresist layer is then removed. After this, silicide layers are formed on the source and drain regions, followed by the formation of metal contacts that lie in the source and drain metal contact openings, and touch the source and drain silicide layers and the bottom isolation layer.

Thus, in the conventional approach, the widths of the source and drain metal contact openings are determined by the widths of the openings in the patterned photoresist layer. As a result, the minimum widths of the source and drain metal contact openings are determined by the minimum feature size that can be photolithographically printed with adequate control.

The minimum feature size has two basic limits: the smallest image that can be projected onto a wafer, and the resolving capability of the photoresist to make use of that image. The smallest image that can be projected onto a wafer is determined by the wavelength of the imaging light and the numerical aperture of the projection lens. The resolving capability of the photoresist is determined, in part, by the shape of the image projected onto the wafer.

For example, when long parallel lines are projected onto the wafer, the photoresist has a higher resolving capability along the lengthwise edges of the lines than when square or circular shapes are projected onto the wafer. As a result, long parallel lines can be formed with smaller minimum feature sizes than square or circular openings.

To increase the density of devices formed on the wafer and thereby reduce costs, the minimum feature size has been continuously scaled down, primarily by decreasing the wavelength of the imaging light and increasing the numerical aperture. However, the density of devices formed on the wafer can be further increased if the metal contact openings could be formed to have widths that are smaller than the minimum feature size of a photolithographically-defined opening. Thus, there is a need for a method of forming a metal contact opening with a width that is smaller than the minimum feature size of a photolithographically-defined opening.

SUMMARY OF THE INVENTION

The present invention provides a method of forming a semiconductor structure that increases the density of the devices formed on a wafer. The method includes forming a first hard mask layer that touches and lies over an isolation layer. The isolation layer has a top surface, and touches and lies over a source structure and a drain structure. The method also includes forming a second hard mask layer that touches and lies over the first hard mask layer. The second hard mask layer has a top surface and a bottom surface. The method additionally includes forming a third hard mask layer that touches and lies over the second hard mask layer. The third hard mask layer has a top surface. The method further includes forming a fourth hard mask layer that touches and lies over the third hard mask layer. The fourth hard mask layer has a top surface. In addition, the method includes etching the fourth hard mask layer to form a number of trenches. Each trench exposes the top surface of the third hard mask layer.

The method of the present invention alternately includes forming a first hard mask layer that touches and lies over an isolation layer. The isolation layer has a top surface, and touches and lies over a source structure and a drain structure. The method also includes forming a second hard mask layer that touches and lies over the first hard mask layer. The second hard mask structure has a top surface and a bottom surface. In addition, the method includes forming a third hard mask layer that touches and lies over the second hard mask layer. The third hard mask layer has a top surface. Further, the method includes forming a fourth hard mask layer that touches and lies over the third hard mask layer. The fourth hard mask layer has a top surface. The method additionally includes forming a first patterned photoresist layer that touches and lies over the fourth hard mask layer. The method further includes forming a second patterned photoresist layer that touches and lies over the fourth hard mask layer. The first patterned photoresist layer and the second patterned photoresist layer expose a number of uncovered regions on the top surface of the fourth hard mask layer.

A better understanding of the features and advantages of the present invention will be obtained by reference to the following detailed description and accompanying drawings which set forth an illustrative embodiment in which the principals of the invention are utilized.

BRIEF DESCRIPTION OF THE DRAWINGS

FIGS. 1A-1D through 9A-9D are views illustrating an example of a method 100 of forming a metal contact opening in accordance with the present invention. FIGS. 1A-9A are plan views. FIGS. 1B-9B are cross-sectional views taken along lines 1B-1B through 9B-9B of FIGS. 1A-9A. FIGS. 1C-9C are cross-sectional views taken along lines 1C-1C through 9C-9C of FIGS. 1A-9A. FIGS. 1D-9D are cross-sectional views taken along lines 1D-1D through 9D-9D of FIGS. 1A-9A.

DETAILED DESCRIPTION OF THE INVENTION

Figure 1A:
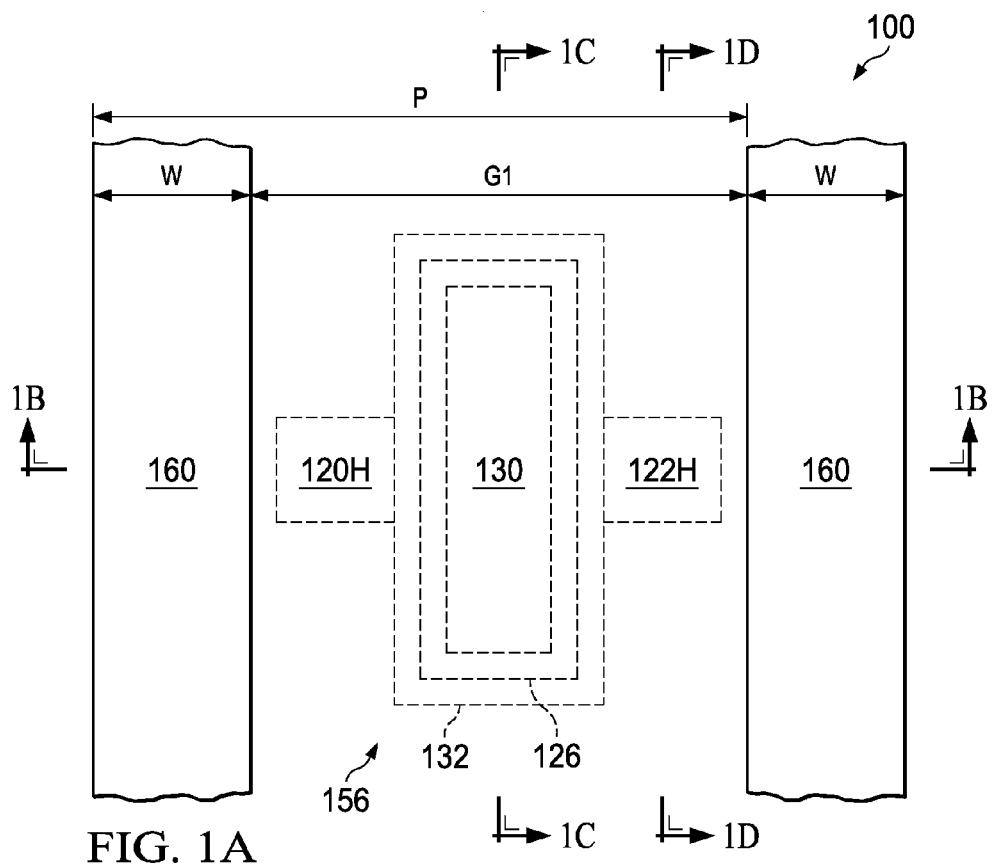
Figure 1B:
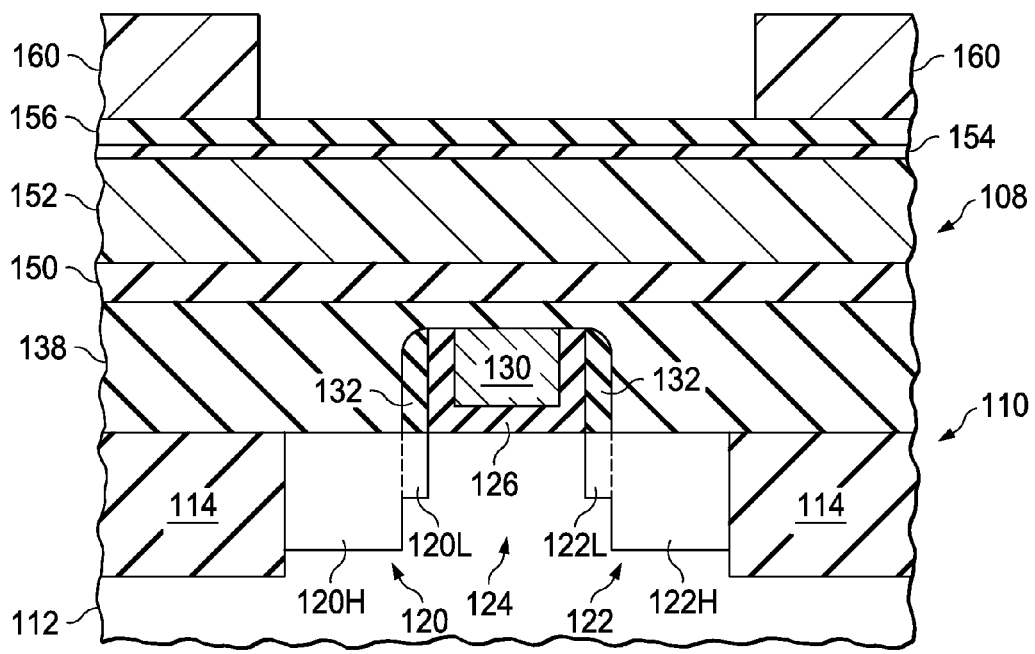
Figure 1C:
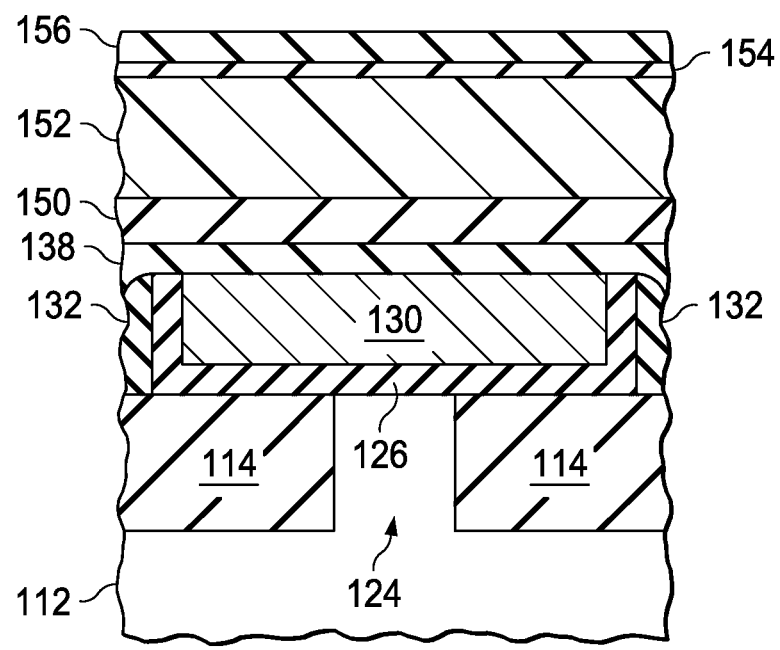
Figure 1D:
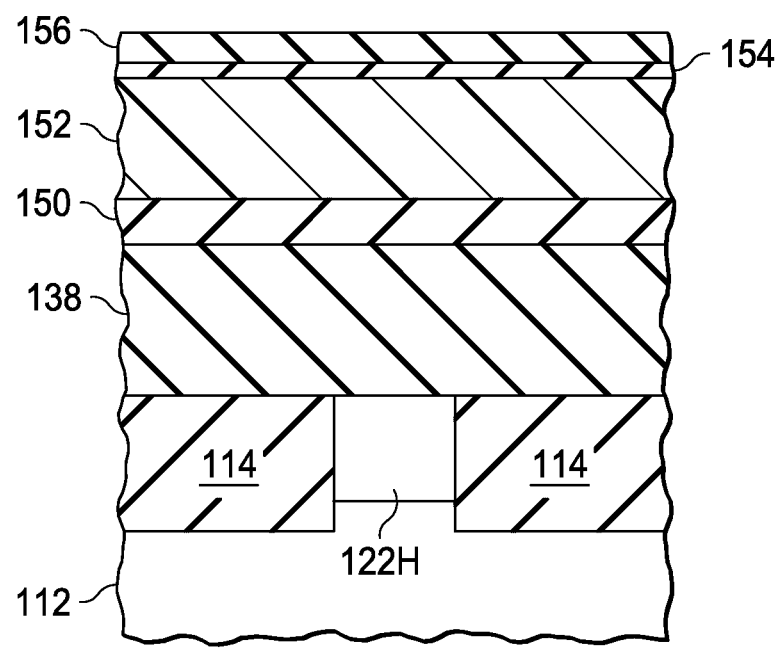
Figure 2A:
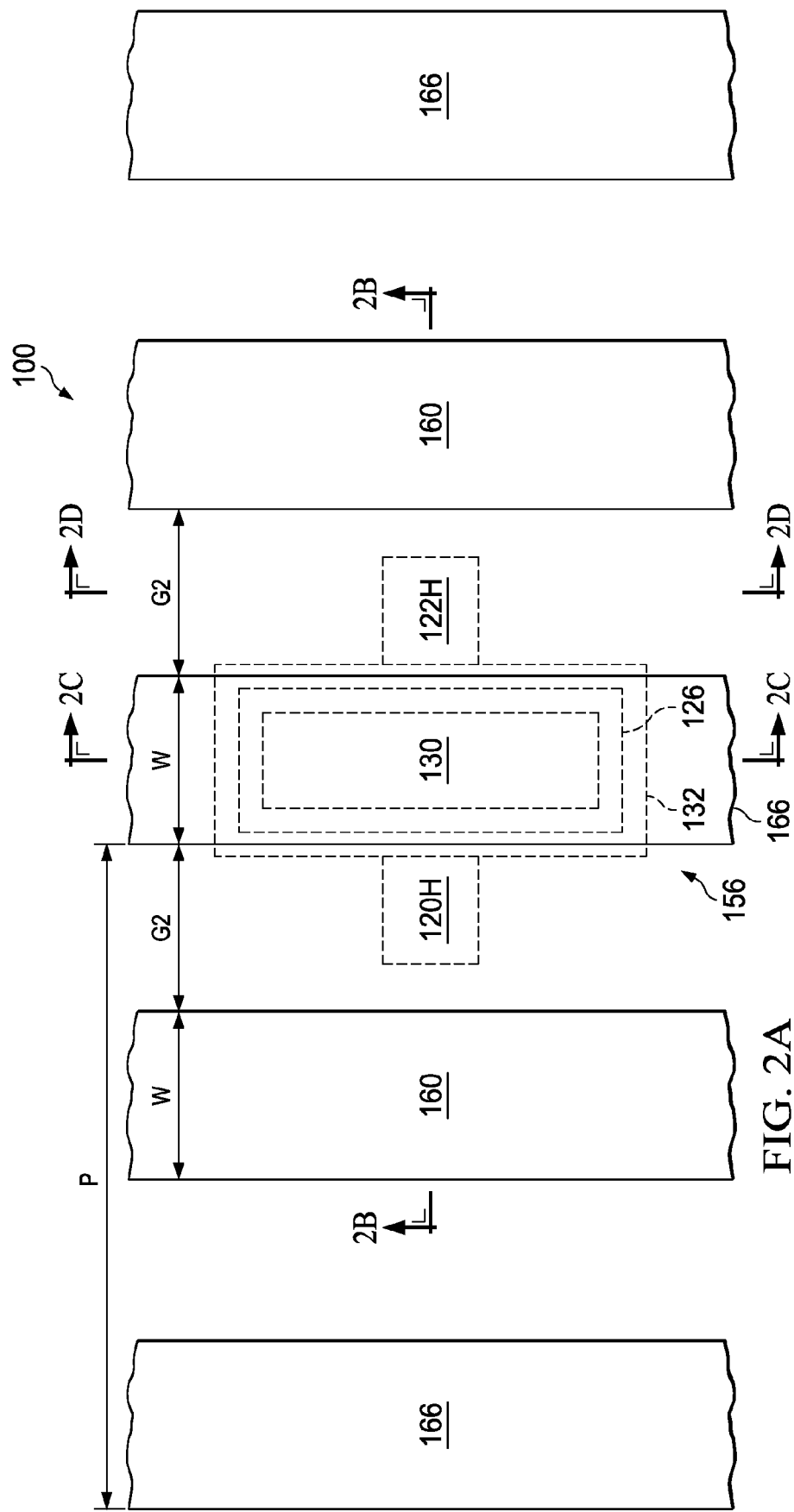
Figure 2B:
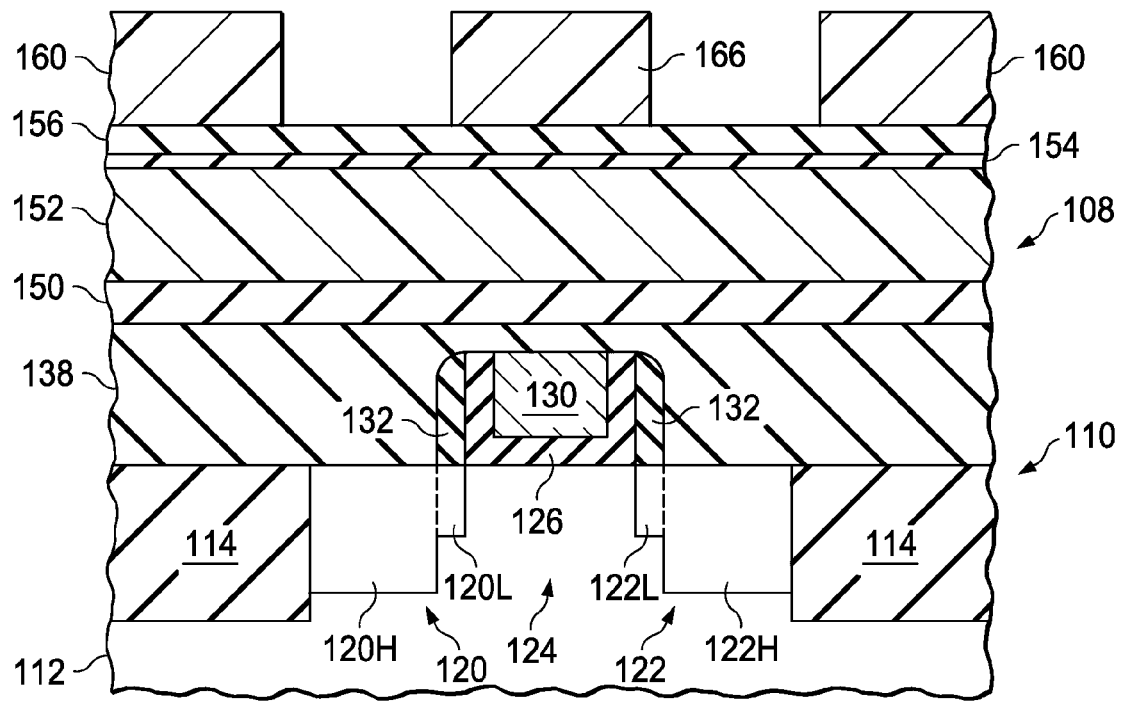
Figure 2C:
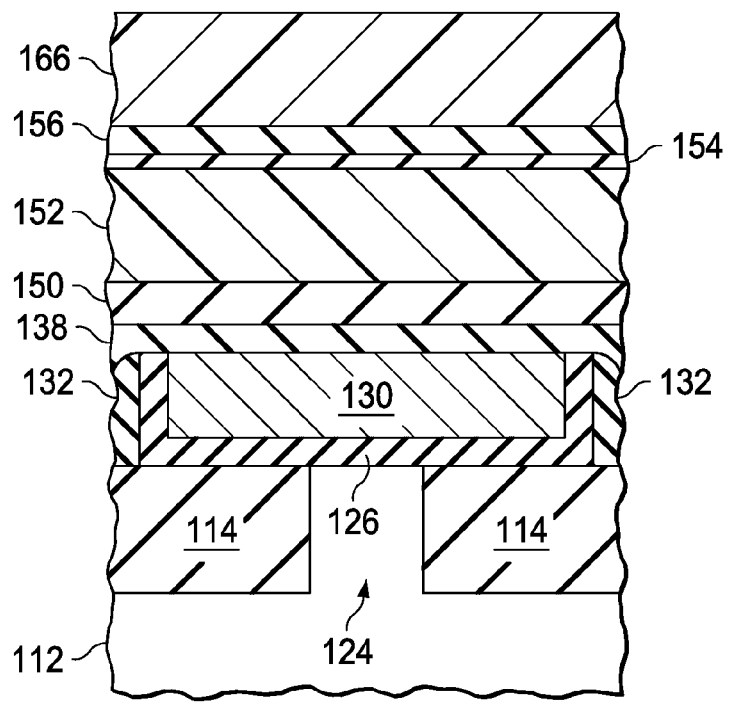
Figure 2D:
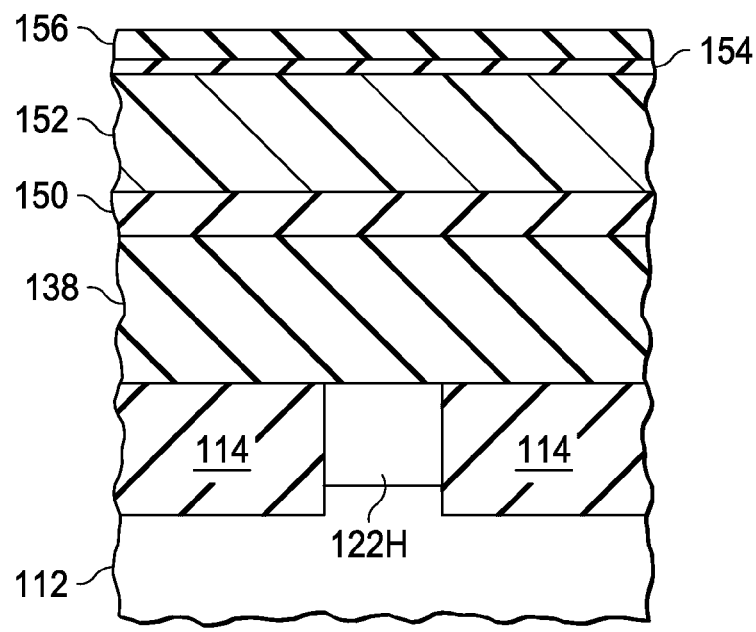
Figure 3B:
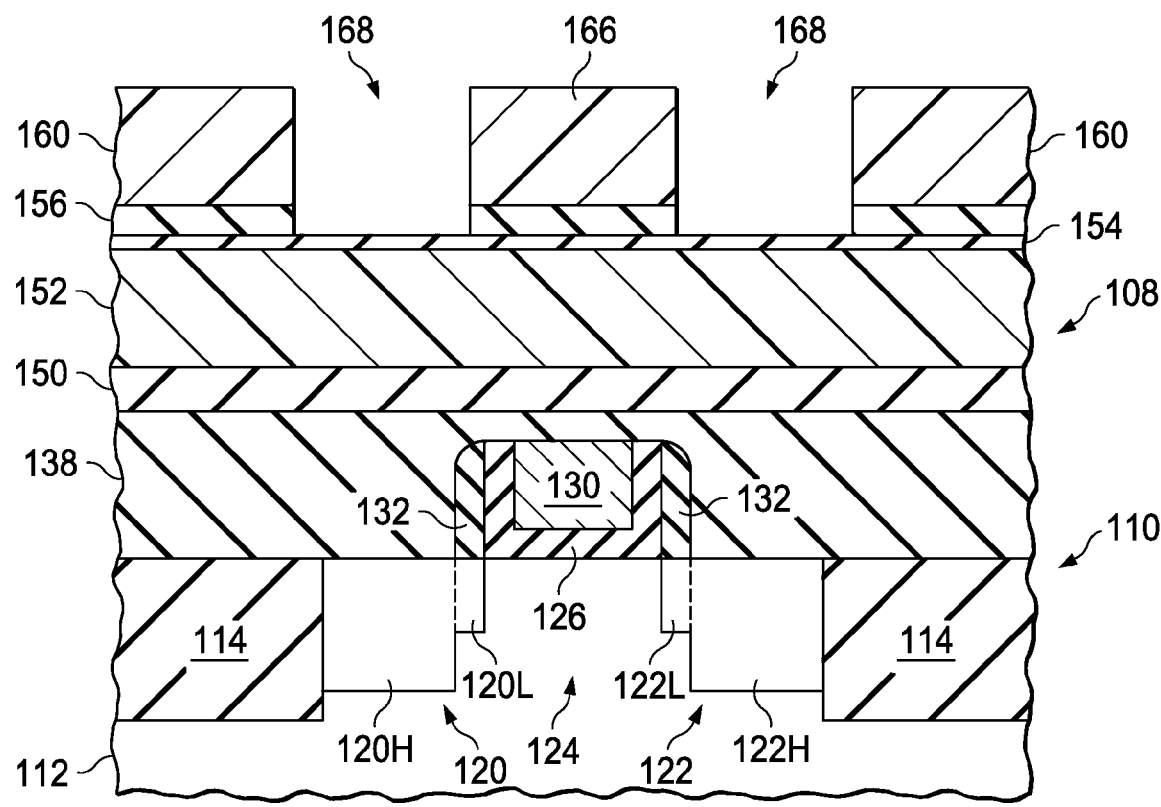
Figure 3A:
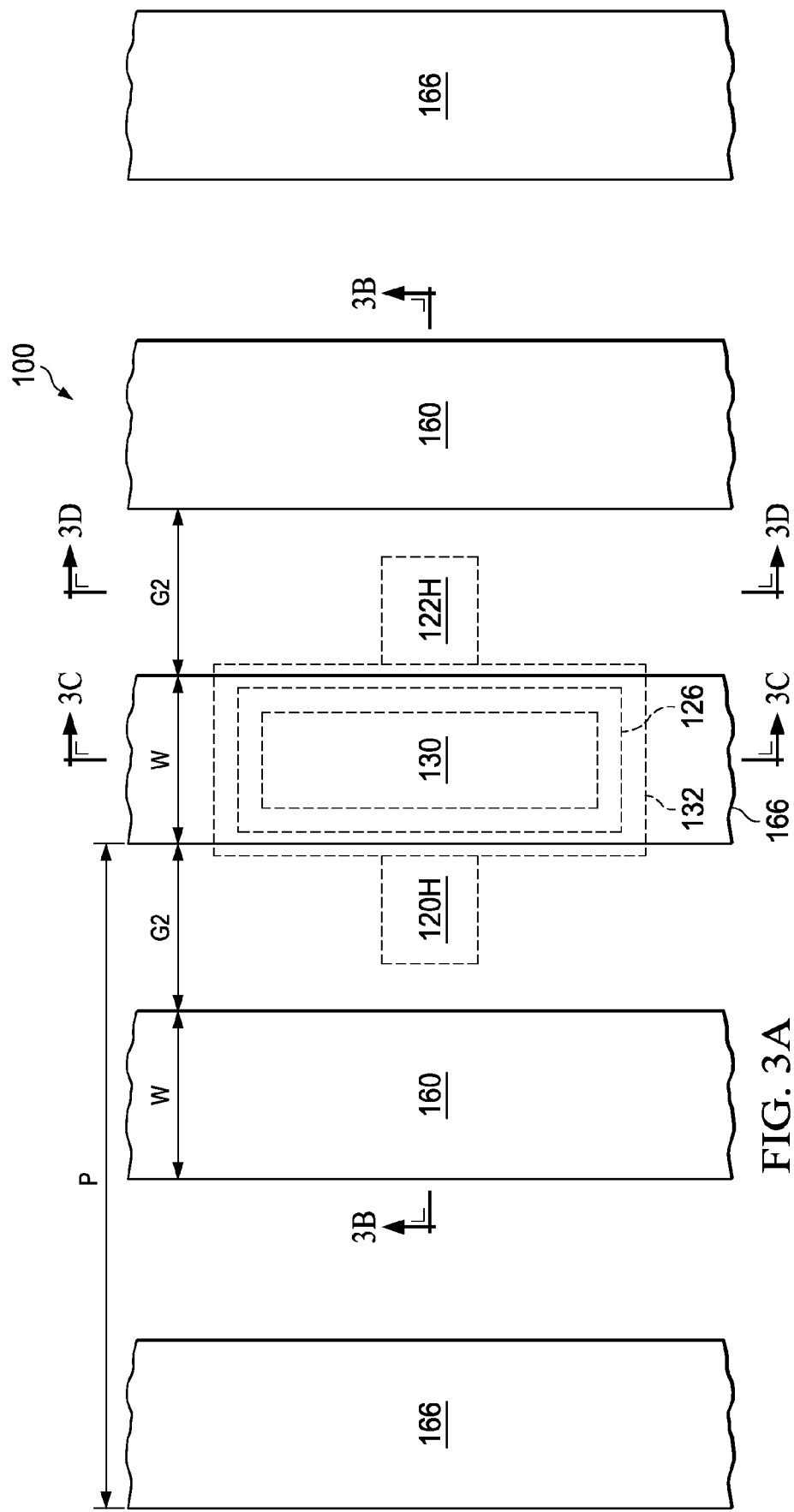
Figure 3C:
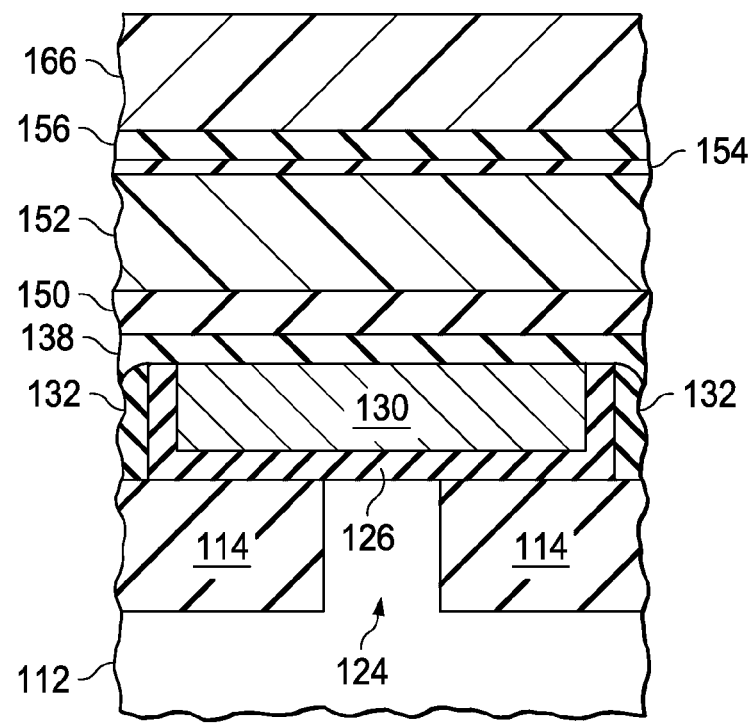
Figure 3D:
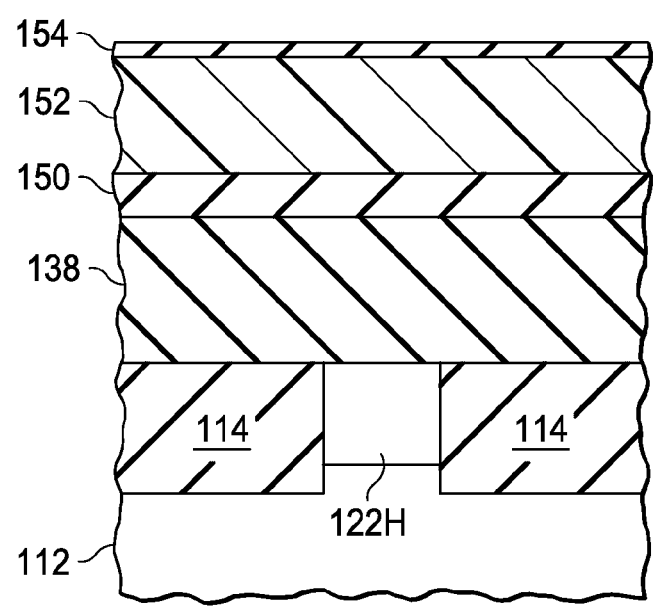
Figure 4A:
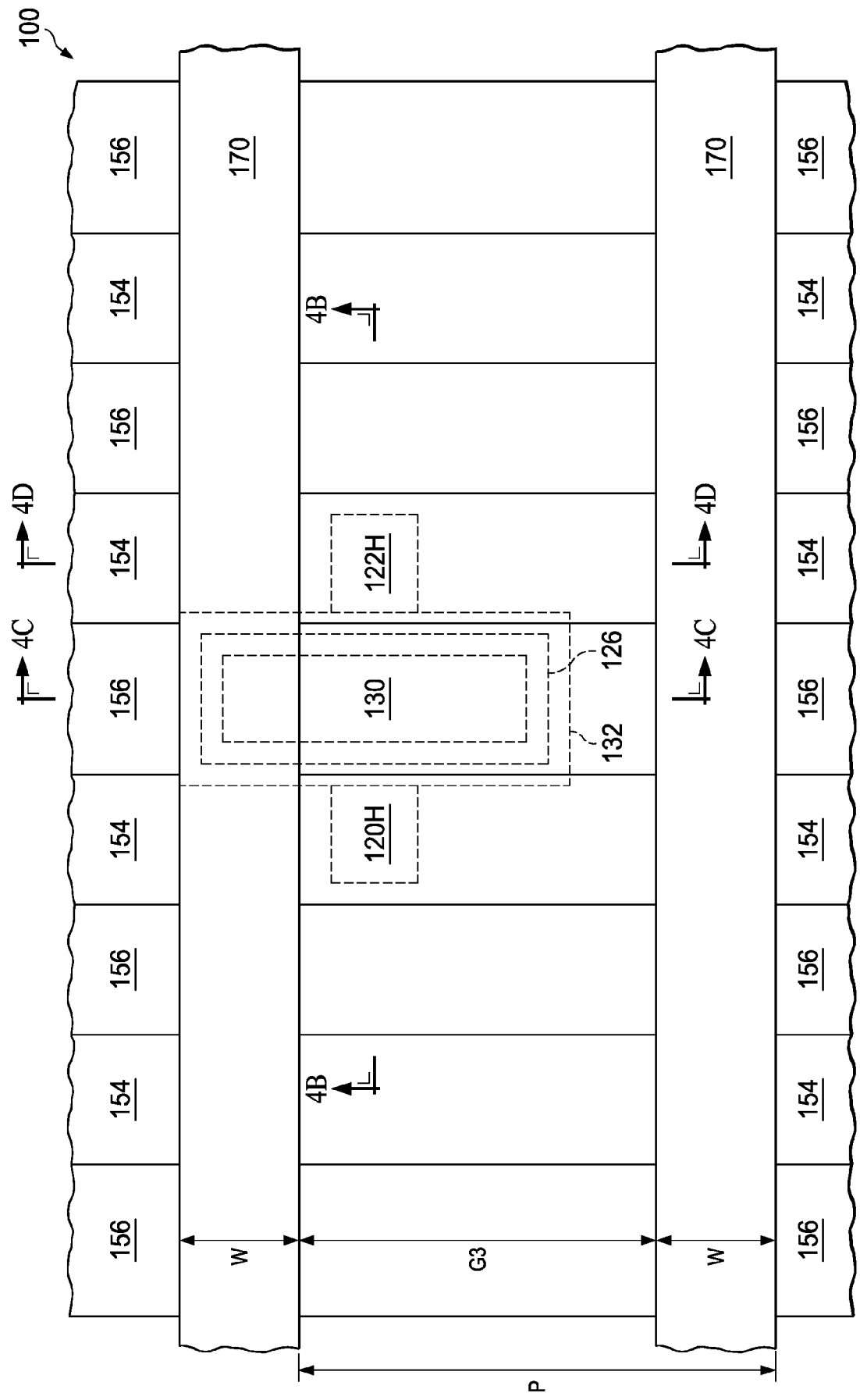
Figure 4B:
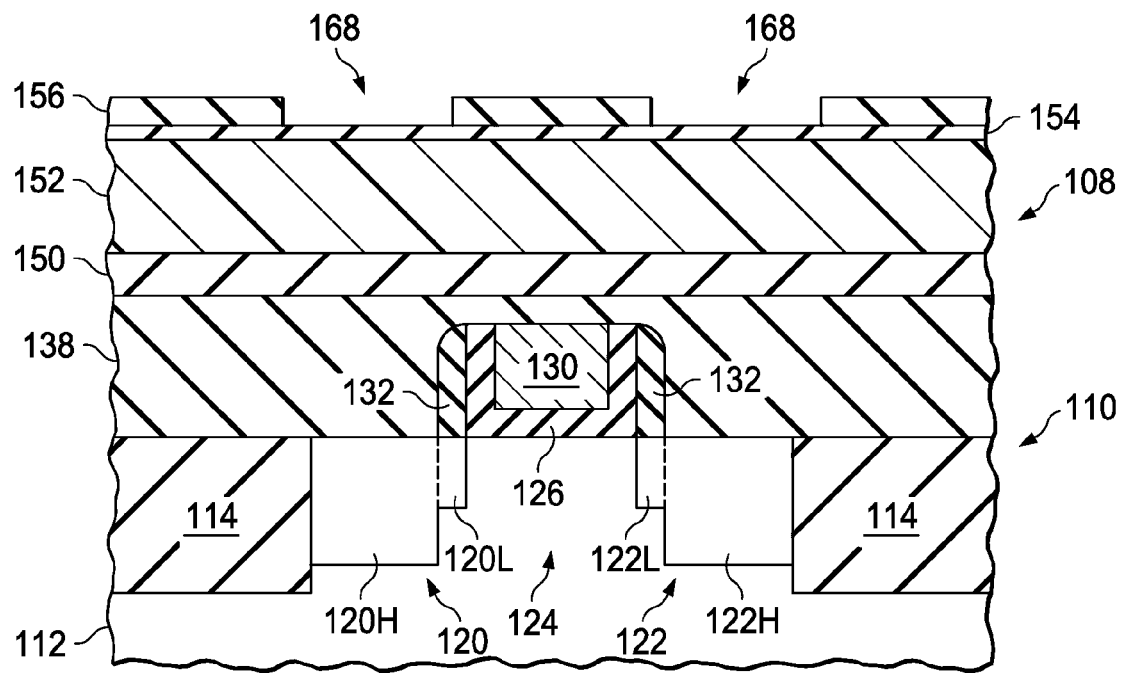
Figure 4C:
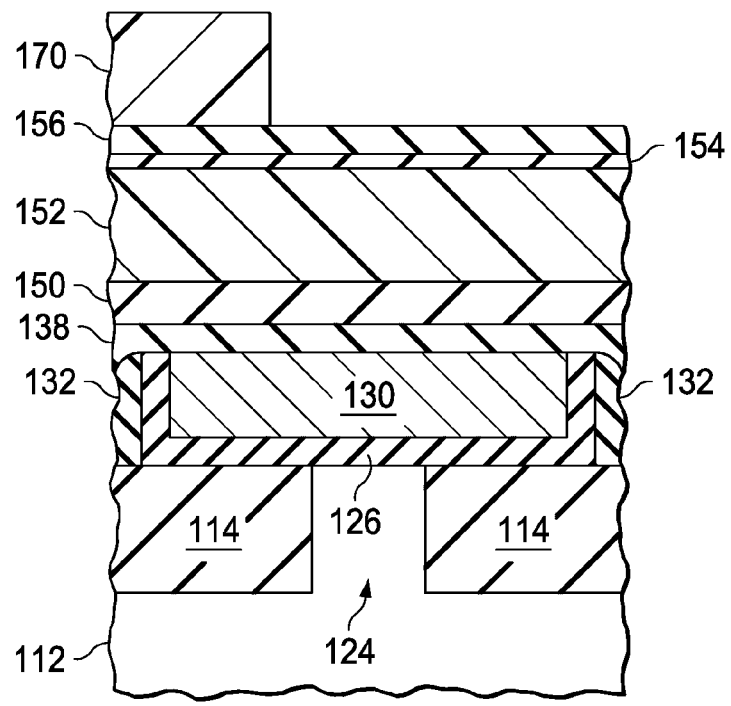
Figure 4D:
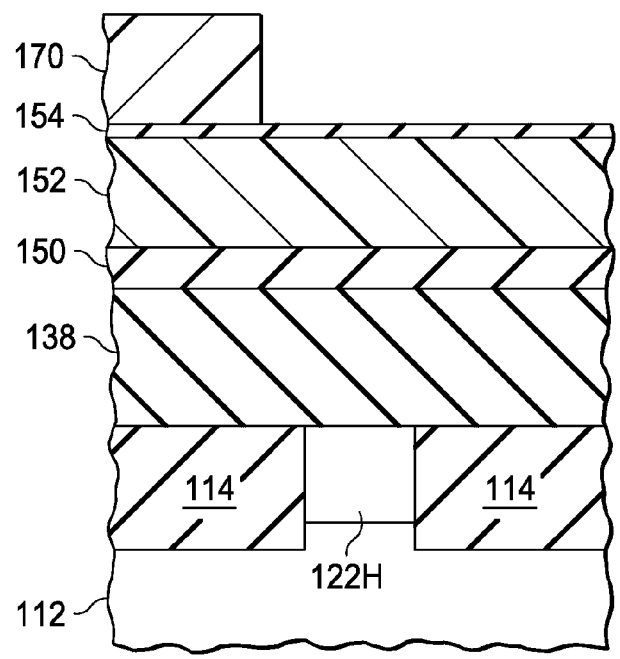
Figure 5B:
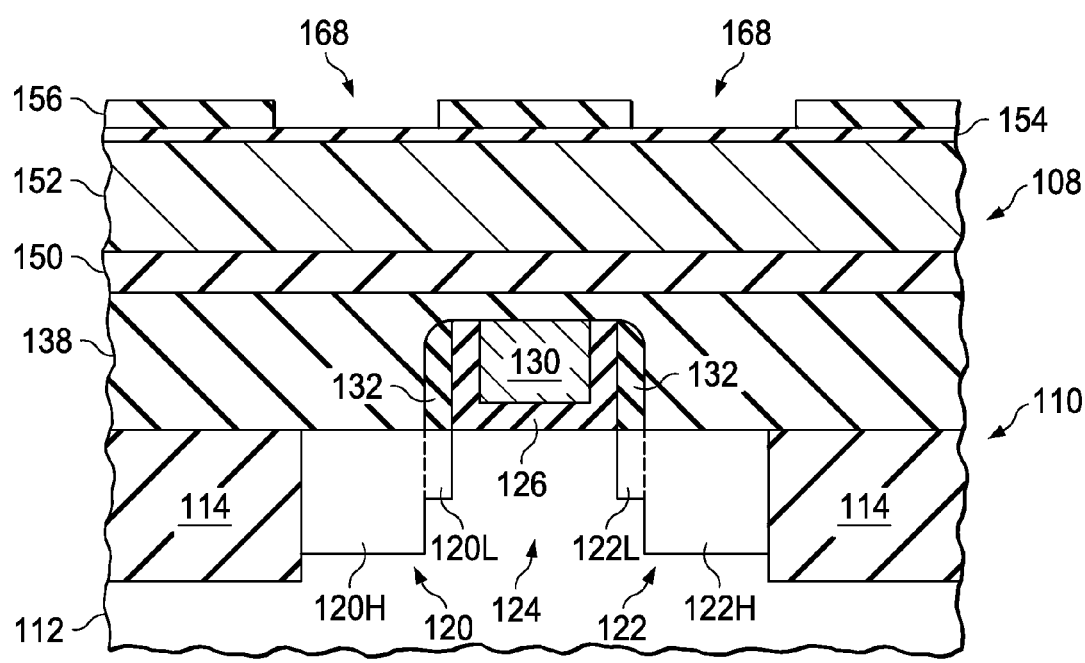
Figure 5A:
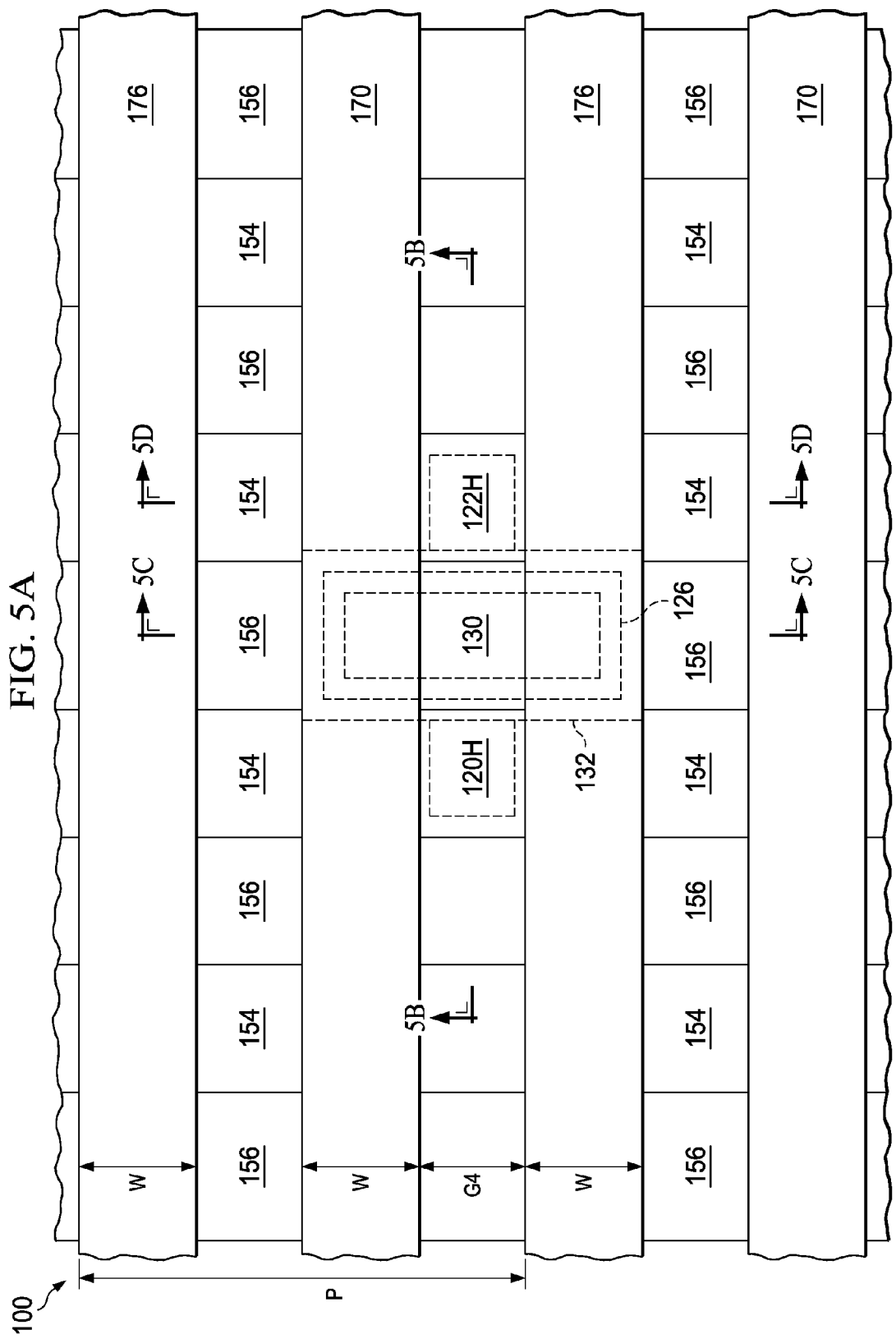
Figure 5C:
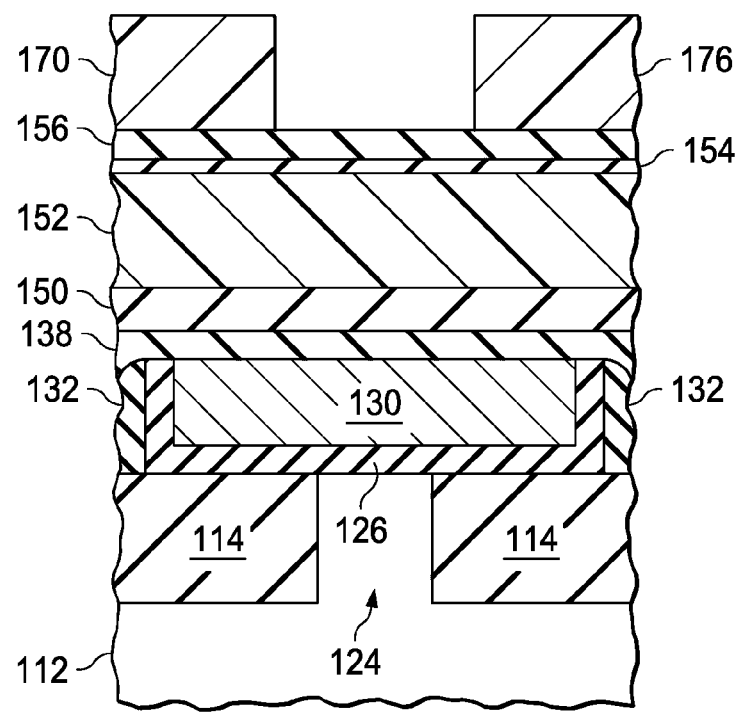
Figure 5D:
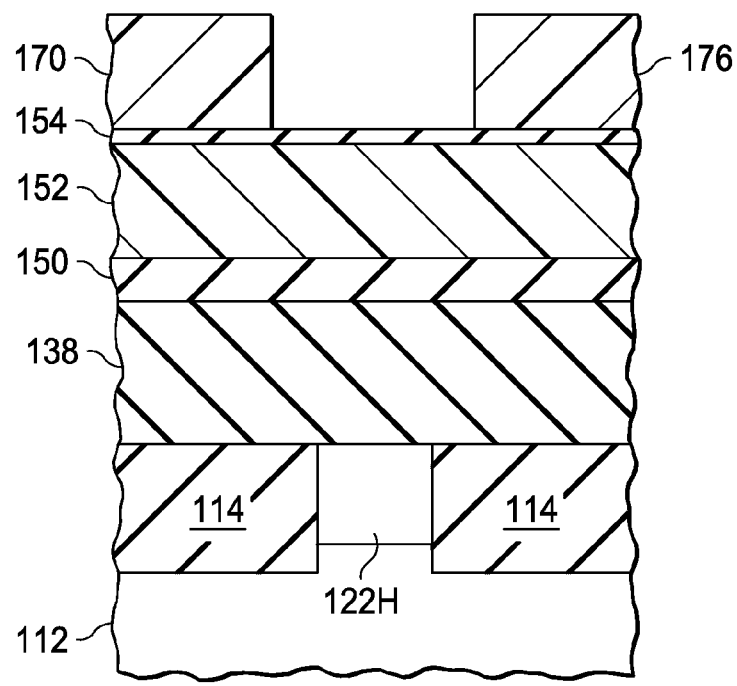
Figure 6A:
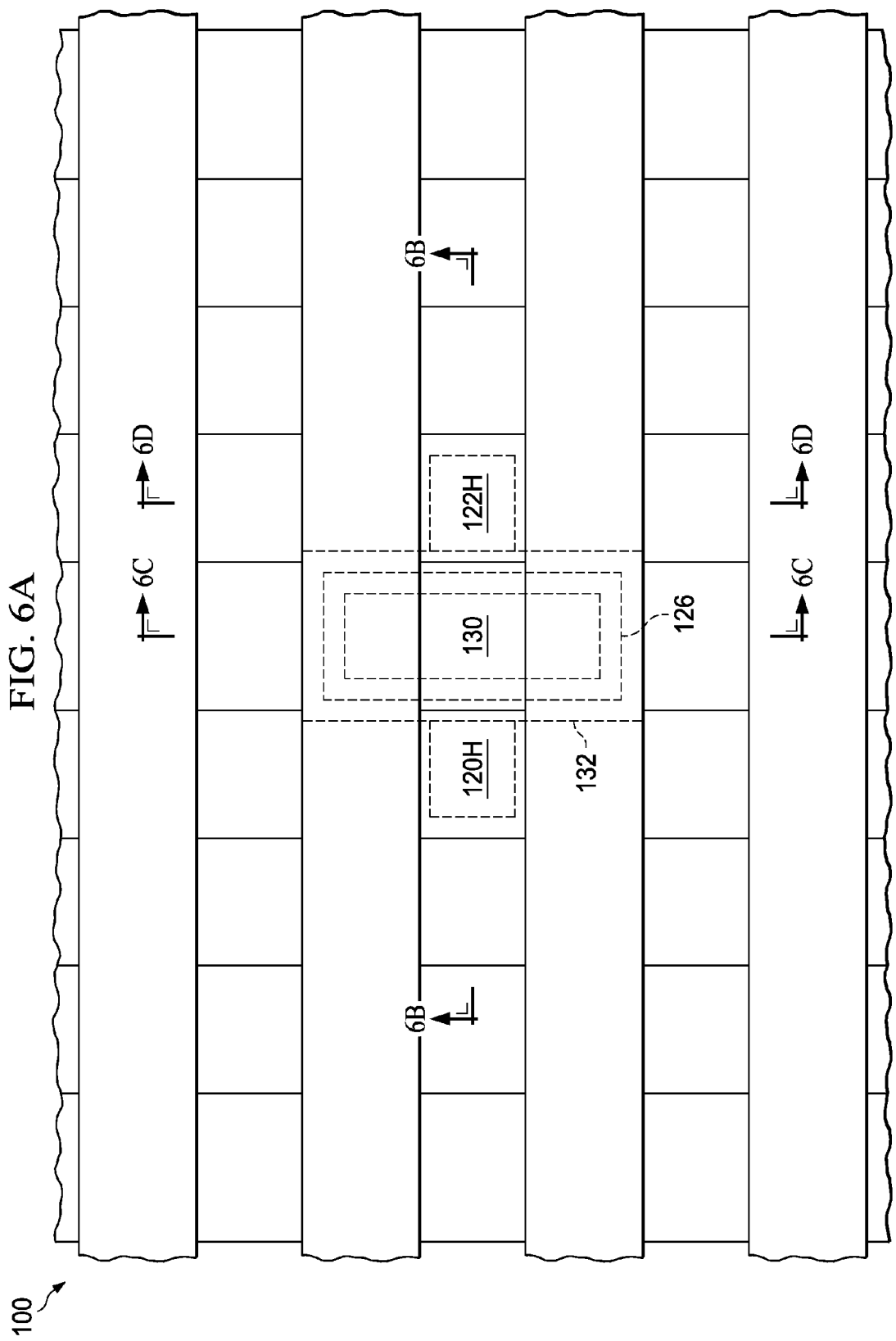
Figure 6B:
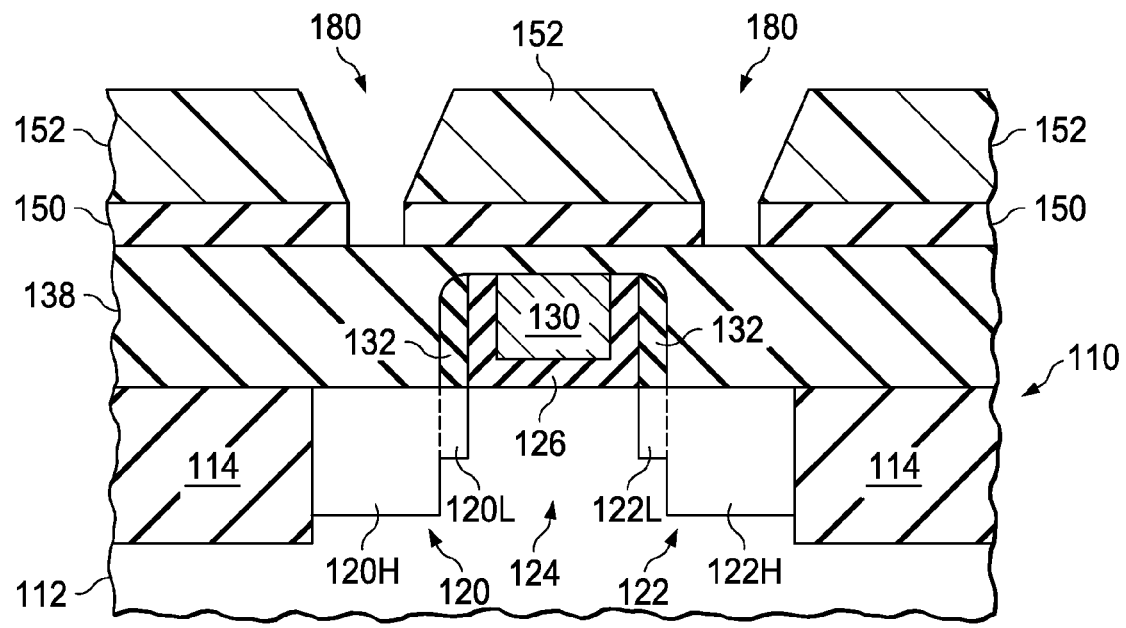
Figure 6C:
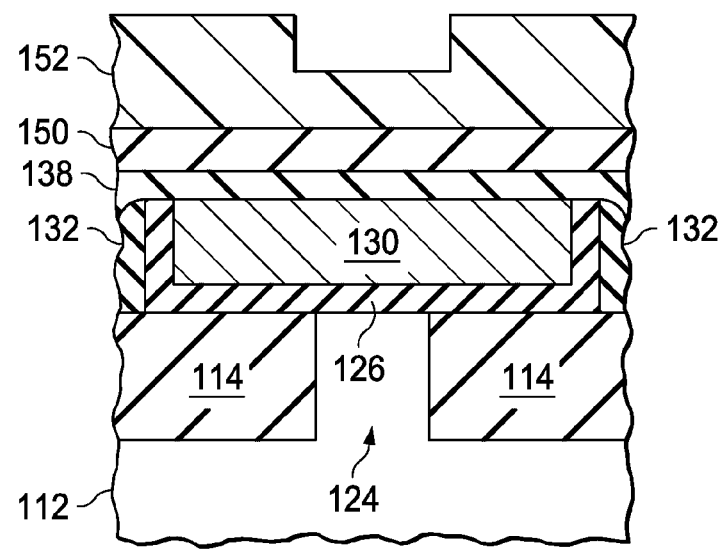
Figure 6D:
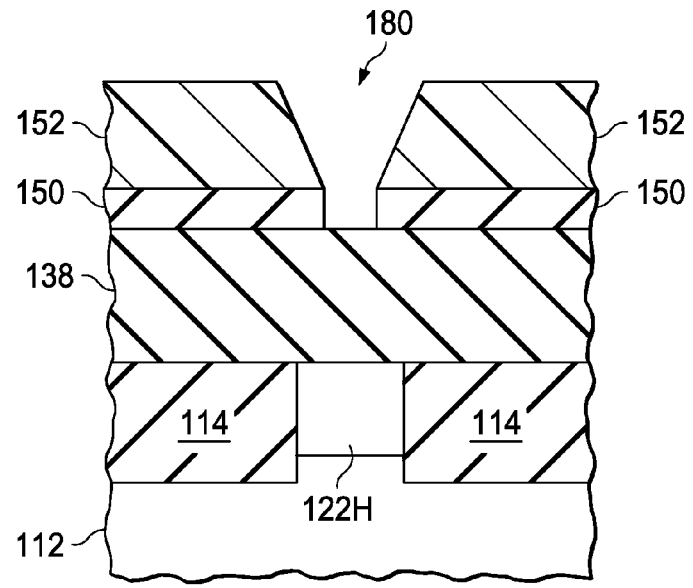
Figure 7B:
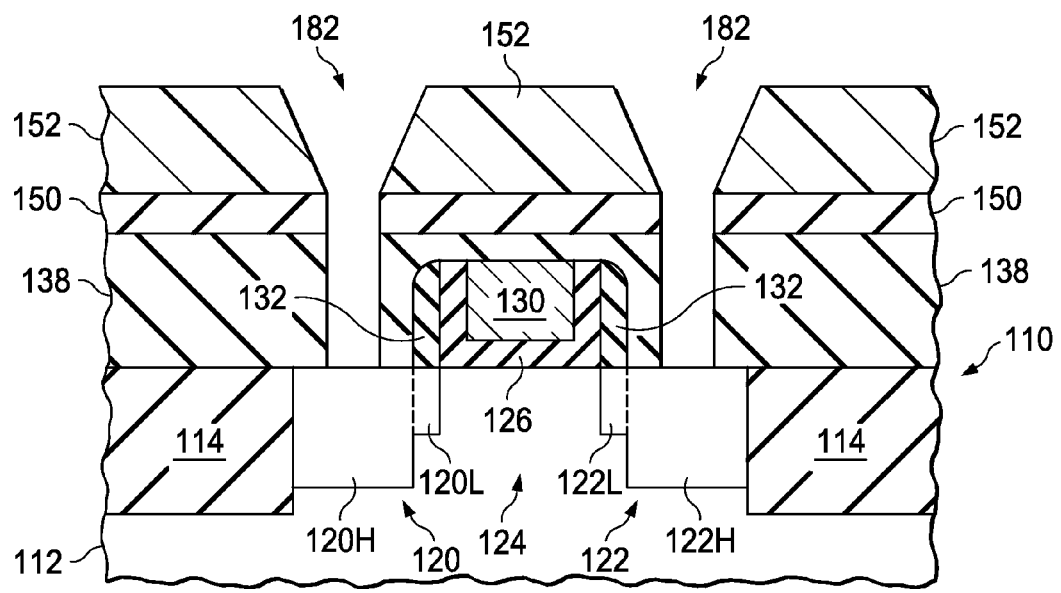
Figure 7C:
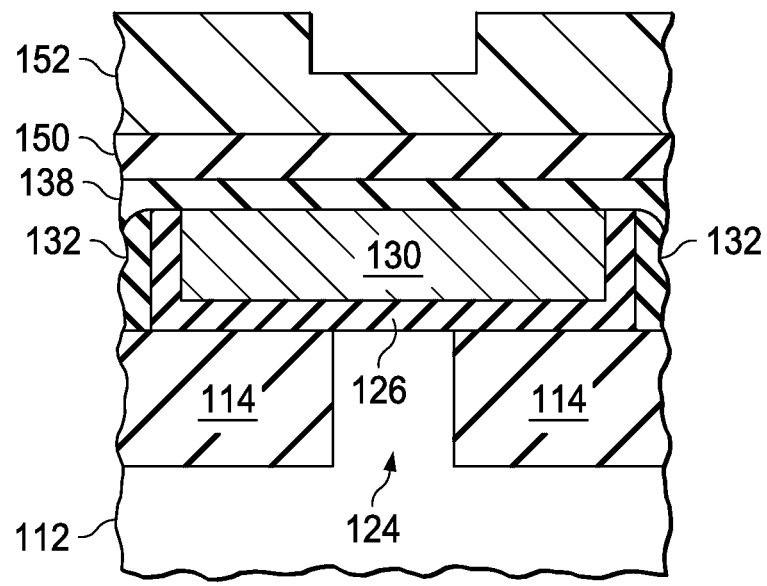
Figure 7D:
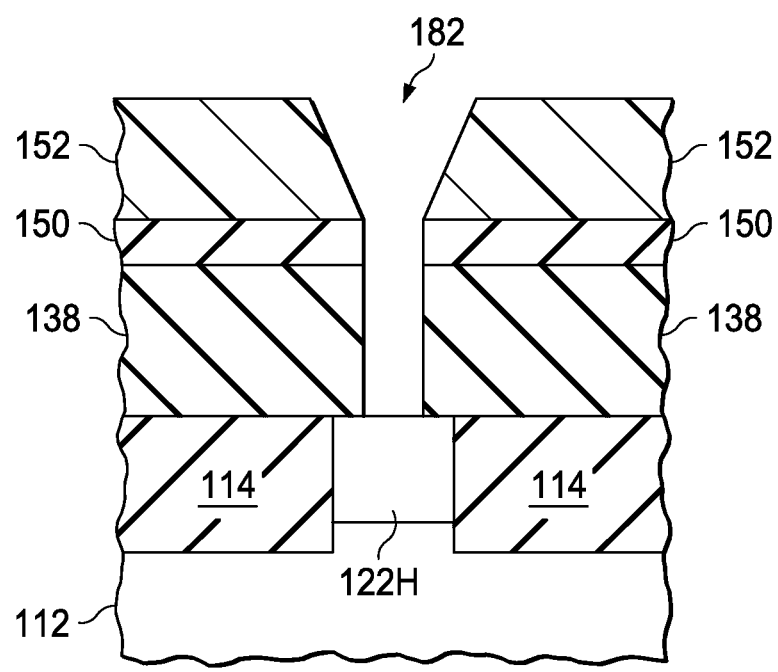
Figure 8B:
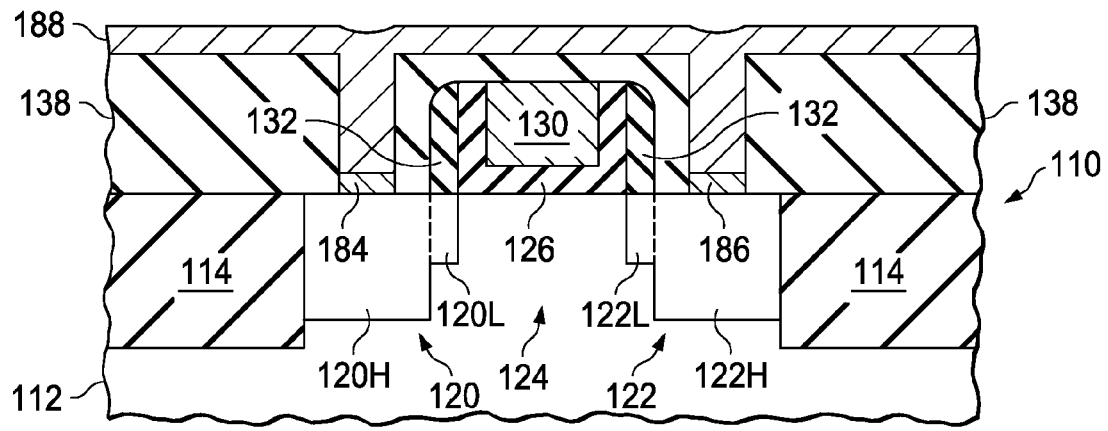
Figure 8C:
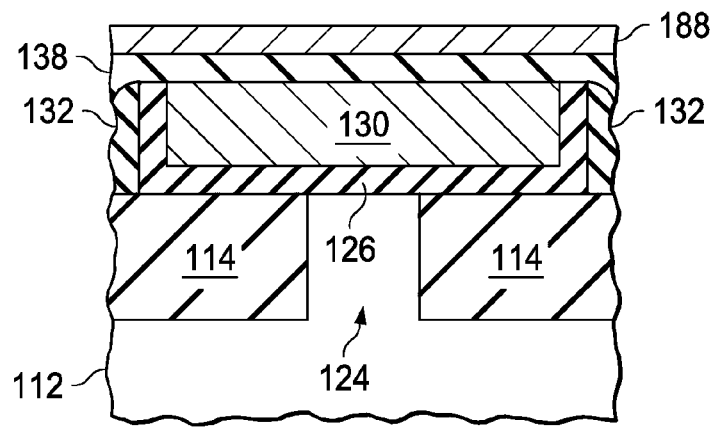
Figure 8D:
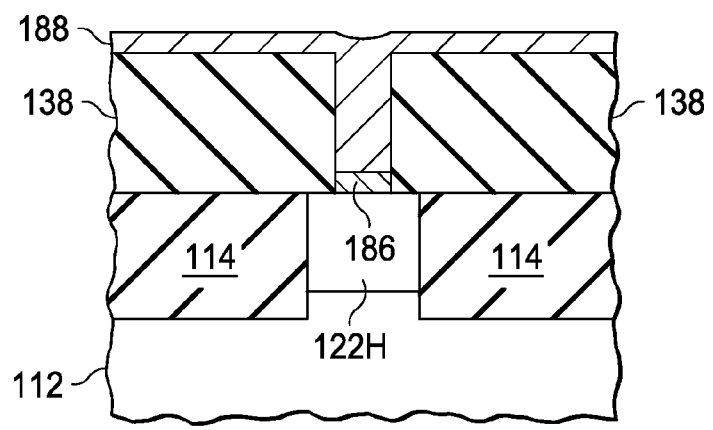
Figure 9B:
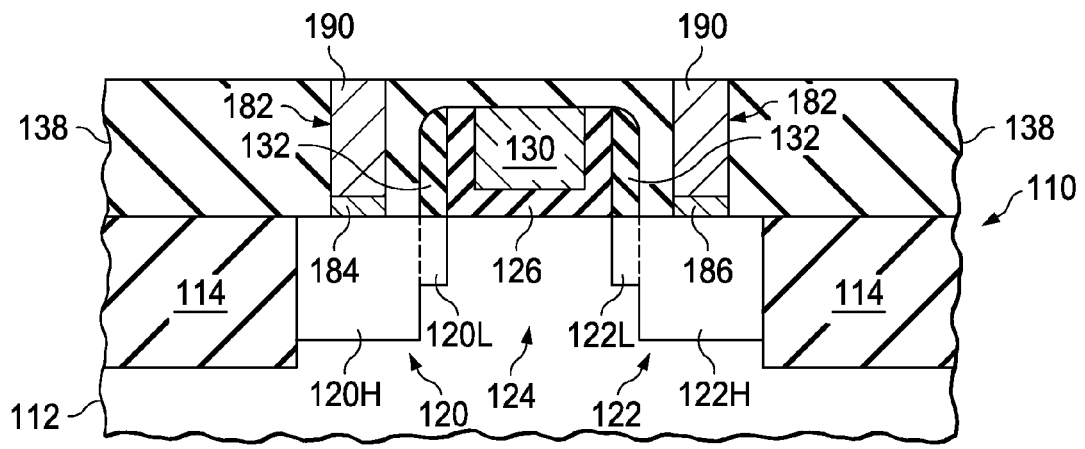
Figure 9C:
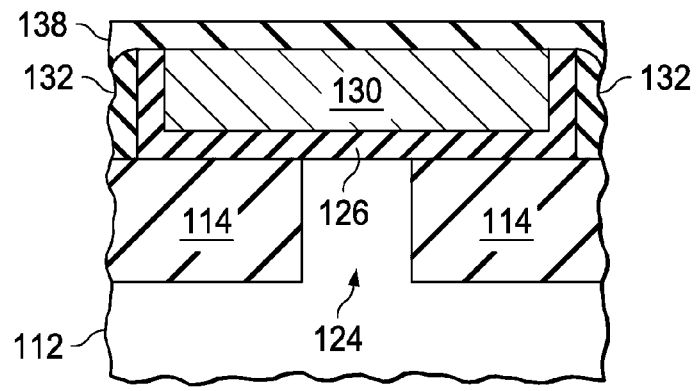
Figure 9D:
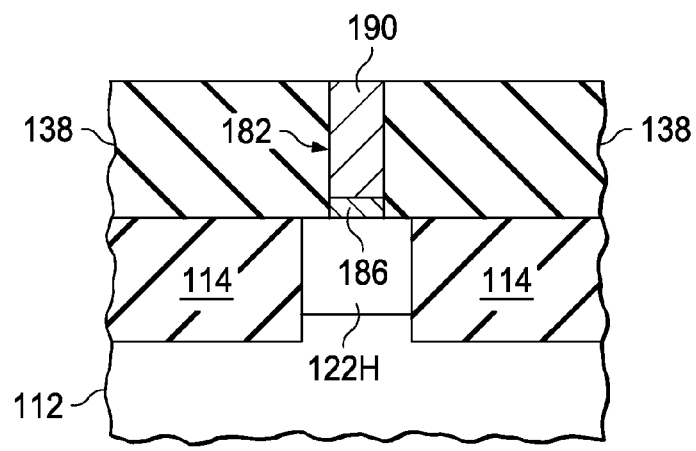

FIGS. 1A-1D through 9A-9D show views that illustrate an example of a method 100 of forming a metal contact opening in accordance with the present invention. FIGS. 1A-9A show plan views, while FIGS. 1B-9B show cross-sectional views taken along lines 1B-1B through 9B-9B of FIGS. 1A-9A, FIGS. 1C-9C show cross-sectional views taken along lines 1C-1C through 9C-9C of FIGS. 1A-9A, and FIGS. 1D-9D show cross-sectional views taken along lines 1D-1D through 9D-9D of FIGS. 1A-9A.

As shown in FIGS. 1A-1D, method 100 utilizes a conventionally-formed metal-gate MOS transistor structure 108. MOS transistor structure 108, in turn, includes a semiconductor body 110 that has a single-crystal-silicon substrate region 112, and a trench isolation structure 114 that touches substrate region 112.

In addition, semiconductor body 110 includes a source 120 and a drain 122 that each touch substrate region 112. The source 120 and drain 122 each has a conductivity type that is the opposite of the conductivity type of substrate region 112. Source 120 includes a lightly-doped region 120L, and a heavily-doped region 120H. Similarly, drain 122 includes a lightly-doped region 122L, and a heavily-doped region 122H. Further, substrate region 112 has a channel region 124 that lies between source 120 and drain 122.

As also shown in FIGS. 1A-1D, MOS transistor structure 108 includes a high-k gate dielectric structure 126 that touches and lies over channel region 124, and a metal gate 130 that touches gate dielectric structure 126 and lies over channel region 124. In addition, MOS transistor structure 108 includes a sidewall spacer 132 that laterally surrounds gate 130, and a bottom isolation layer 138 that touches sidewall spacer 132. Bottom isolation layer 138 also touches and lies over source region 120H and drain region 122H.

As further shown in FIGS. 1A-1D, method 100 begins by forming a first hard mask layer 150 that touches and lies over bottom isolation layer 138. The first hard mask layer 150 can be implemented with, for example, a layer of silicon oxynitride (SiON) or a layer of silicon carbon nitride (SiCN).

After the first hard mask layer 150 has been formed, a second hard mask layer 152 is formed to touch and lie over the first hard mask layer 150. The second hard mask layer 152, which is substantially thicker than the first hard mask layer 150, can be implemented with, for example, a chemically-vapor deposited (CVD) layer of an amorphous carbon material such as an advanced patterning film (APF).

After the second hard mask layer 150 has been formed, a third hard mask layer 154 is formed to touch and lie over the second hard mask layer 152. The third hard mask layer 154 can be implemented with, for example, a layer of silicon nitride (SiN) or a layer of silicon oxynitride (SiON).

After the third hard mask layer 154 has been formed, a fourth hard mask layer 156 is formed to touch and lie over the third hard mask layer 150. The fourth hard mask layer 156 can be implemented with, for example, a layer of oxide that touches and lies over the third hard mask layer 154, and a layer of silicon nitride (SiN) that touches and lies over the layer of oxide. The first hard mask layer 150 is thicker than the combined thicknesses of the third hard mask layer 154 and the fourth hard mask layer 156.

After the fourth hard mask layer 156 has been formed, a patterned photoresist layer is formed is formed as a number of spaced-apart strips 160 that touch and lie over the fourth hard mask layer 156. The strips 160 of patterned photoresist layer are formed in a conventional manner, which includes depositing a layer of photoresist, projecting a light through a patterned black/clear glass plate known as a mask to form a patterned image on the layer of photoresist, and removing the imaged photoresist regions, which were softened by exposure to the light. The strips 160 of patterned photoresist layer can also include an underlying anti-reflective coating.

Pitch is the distance from one edge of a feature to a corresponding edge of an adjacent feature. The minimum pitch is equal to $2(Ki)*(\lambda/NA)$, where Ki represents the difficulty of the lithographic process (the resolving capability), $\lambda$ represents the wavelength of the imaging light, and NA represents the numerical aperture of the lens.

Thus, using a current-generation imaging light with a wavelength of 193 nm and a lens with a numerical aperture of 1.35 (using water immersion), a minimum pitch of approximately 80 nm can be achieved when the minimum Ki approaches its practical limit of approximately 0.28.

In the present example, although a minimum pitch of approximately 80 nm is possible, the strips 160 of patterned photoresist layer are formed to have a pitch P of 168 nm. Further, each strip 160 has a width W equal to ¼ P (42 nm), while adjacent strips 160 are separated by a gap G1 of ¾ P (126 nm).

As shown in FIGS. 2A-2D, after the strips 160 of patterned photoresist layer have been formed, a second patterned photoresist layer is formed in a conventional manner as a number of spaced-apart stripes 166 that touch and lie over the fourth hard mask layer 156. The stripes 166 of patterned photoresist layer can also include an underlying anti-reflective coating.

The stripes 166, which are spaced apart from the strips 160, lie between the strips 160 in an alternating manner to expose a number of uncovered regions on the top surface of the fourth hard mask layer 156. In the present example, the stripes 166 of patterned photoresist layer are also formed to have the pitch P of 168 nm. Further, each stripe 166 has the width W equal to ¼ P (42 nm). Each stripe 166 is also spaced apart from each adjacent strip 160 by a gap G2 of ¼ P.

As shown in FIGS. 3A-3D, after the stripes 166 of patterned photoresist layer have been formed, the uncovered regions on the top surface of the fourth hard mask layer 156 are etched to form a number of trenches 168. Each of the trenches 168 extends through the fourth hard mask layer 156 to expose the top surface of the third hard mask layer 154. Following this, the strips 160 and stripes 166 of the patterned photoresist layers are removed in a conventional manner, such as with an ash process.

As shown in FIGS. 4A-4D, after the patterned photoresist layers 160 and 166 have been removed, a patterned photoresist layer is formed is formed in a conventional manner as a number of spaced-apart strips 170 that touch and lie over the fourth hard mask layer 156. The strips 170 also extend into the trenches 168 to touch and lie over portions of the third hard mask layer 154. The strips 170 of patterned photoresist layer can also include an underlying anti-reflective coating.

The strips 170 are substantially orthogonal to the trenches 168. Further, in the present example, the strips 170 of patterned photoresist layer are formed to have the pitch P of 168 nm. Further, each strip 170 has a width W equal to ¼ P (42 nm), while adjacent strips 170 are separated by a gap G3 of ¾ P (126 nm).

As shown in FIGS. 5A-5D, after the strips 170 of patterned photoresist layer have been formed, a patterned photoresist layer is formed in a conventional manner as a number of spaced-apart stripes 176 that touch and lie over the fourth hard mask layer 156. The stripes 176 also extend into the trenches 168 to touch and lie over portions of the third hard mask layer 154. The stripes 176 of patterned photoresist layer can also include an underlying anti-reflective coating.

In the present example, the stripes 176 of patterned photoresist layer are also formed to have the pitch P of 168 nm. Further, each stripe 176 of patterned photoresist layer has a width W equal to ¼ P (42 nm). Each stripe 176 is also spaced apart from each adjacent strip 160 by a gap G4 of ¼ P.

The stripes 176, which are spaced apart from the strips 170, lie between the strips 170 in an alternating manner. The strips and stripes 170 and 176, in combination with the orthogonally-oriented trenches 168, expose a checkerboard pattern of a number of uncovered regions on the top surface of the third hard mask layer 154. (Regions on the top surface of the fourth hard mask layer 156 are also exposed by the strips 170 and stripes 176.)

As shown in FIGS. 6A-6D, after the stripes 176 of patterned photoresist layer have been formed, the uncovered regions on the top surface of the third hard mask layer 154 are etched to form a number of third hard mask openings. The etch continues until a number of uncovered regions on the top surface of the second hard mask layer 152 are exposed by the third hard mask openings. In the present example, the etchant is selective so that more of the third hard mask layer 154 is etched than the fourth hard mask layer 156.

After the uncovered regions on the top surface of the second hard mask layer 152 have been exposed, the etchant is changed and the uncovered regions on the top surface of the second hard mask layer 152 are etched to form a number of second hard mask openings. The etch continues until a number of uncovered regions on the top surface of the first hard mask layer 150 are exposed by the second hard mask openings. In the present example, the etchant is selective so that more of the second hard mask layer 152 is etched than the fourth hard mask layer 156 or the third hard mask layer 154.

During the etch of the second hard mask layer 152, the strips and stripes 170 and 176 are etched away. In addition, the second hard mask layer 152 is etched with a heavy polymer etch, which forms the second hard mask openings through the second hard mask layer 152 to have tapered side wall surfaces.

Thus, the thickness of the second hard mask layer 152 determines (along with other factors such as the etchant) the widths of the second hard mask openings on the bottom surface of the second hard mask layer 152. In the present example, the second hard mask openings at the top surface of the second hard mask layer 152 have widths of approximately 42 nm, while the second hard mask openings at the bottom surface of the second hard mask layer 152 have widths of approximately 20 nm.

After the uncovered regions on the top surface of the first hard mask layer 150 have been exposed, the etchant is changed and the uncovered regions on the top surface of the first hard mask layer 150 are etched to form a number of first hard mask openings. The etch continues until a number of uncovered regions on the top surface of bottom isolation layer 138 are exposed by the first hard mask openings.

During the etch of the first hard mask layer 150, the fourth hard mask layer 156 and the third hard mask layer 154 are removed, thereby exposing the top surface of the second hard mask layer. In the present example, the etchant is selective so that more of the first hard mask layer 150 is etched than the second hard mask layer 152. In addition, the first hard mask openings through the first hard mask layer 150 have widths of approximately 20 nm as a result of the widths of the second hard mask openings at the bottom surface of the second hard mask 152.

Thus, the uncovered regions of the third hard mask layer 154, the underlying regions of the second hard mask layer 152, and the underlying regions of the first hard mask layer 150 are etched to form a number of mask openings 180 that extend through the second hard mask layer 152 and the first hard mask layer 150. The mask openings 180 each exposes an uncovered region on the top surface of bottom isolation layer 138.

The mask openings 180 through the second hard mask layer 152 are formed by the second hard mask openings, while the mask openings 180 through the first hard mask layer 150 are formed by the first hard mask openings. Once the mask openings 180 have been formed, the second hard mask layer 152 can optionally be removed. In the present example, method 100 continues without removing the second hard mask layer 152 at this point.

As shown in FIGS. 7A-7D, after the mask openings 180 have been formed, the etchant is changed and the uncovered regions on the top surface of bottom isolation layer 138 are etched. The etch forms a number of metal contact openings 182 in bottom isolation layer 138, where one of the metal contact openings 182 exposes a top surface region of source region 120H, and one of the metal contact openings 182 exposes a top surface region of drain region 122H.

In the present example, the metal contact openings 182 each have widths of approximately 20 nm due to the widths of the first hard mask openings, which are the same as the minimum widths of the mask openings 180. After the metal contact openings 182 have been formed, the first hard mask layer 150 and the second hard mask layer 152 are removed in a conventional manner.

As shown in FIGS. 8A-8D, once the first hard mask layer 150 and the second hard mask layer 152 have been removed, a source metal silicide region 184 that touches and lies over source region 120H, and a drain metal silicide region 186 that touches and lies over drain region 122H are formed in a conventional manner. Following this, a metal contact layer 188, such as a layer of tungsten (W), is deposited to touch the top surface of bottom isolation layer 138 and fill up the metal contact openings 182 in bottom isolation layer 138.

As shown in FIGS. 9A-9D, after metal contact layer 188 has been formed, metal contact layer 188 is planarized in a conventional manner, such as with chemical-mechanical polishing, to expose the top surface of bottom isolation layer 138. The planarization forms metal contacts 190 in the metal contact openings 182. The metal contacts 190 make electrical connections to the source and drain metal silicide regions 184 and 186. Method 100 then continues with conventional steps to complete the formation of a metal interconnect structure.

One of the advantages of the present invention is that method 100 forms metal contact openings 182 which have widths that are substantially smaller than the minimum pitch. In the present example, the metal contact openings 182 have widths of approximately 20 nm, while the minimum pitch P is approximately 80 nm (using a wavelength 193 nm, a numerical aperture of 1.35, and a Ki of 0.28).

Another of the advantages of the present invention is that method 100 forms metal contact openings 182 with widths that are substantially smaller than the minimum feature size of a photolithographically-defined opening. In the present example, the metal contact openings 182 have widths of approximately 20 nm, while the minimum feature size of a photolithographically-defined opening is approximately 90-100 nm when the minimum pitch is approximately 80 nm. As a result of forming metal contact openings 182 which have widths that are substantially smaller than the minimum pitch and the minimum feature size of a photolithographically-defined opening, the density of the devices on a wafer can be increased substantially.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A method of forming a semiconductor structure comprising:
    forming a first hard mask layer that touches and lies over an isolation layer, the isolation layer having a top surface, and touching and lying over a source structure and a drain structure;
    forming a second hard mask layer that touches and lies over the first hard mask layer, the second hard mask layer having a top surface and a bottom surface;
    forming a third hard mask layer that touches and lies over the second hard mask layer, the third hard mask layer having a top surface;
    forming a fourth hard mask layer that touches and lies over the third hard mask layer, the fourth hard mask layer having a top surface;
    forming a first photoresist pattern by:
        depositing a first photoresist layer, imaging the first photoresist layer, and removing imaged photoresist regions of the first photoresist layer; and
        then, depositing a second photoresist layer, imaging the second photoresist layer, and removing imaged photoresist regions of the second photoresist layer; and
    etching the fourth hard mask layer using the first photoresist pattern to form a number of trenches, each trench exposing the top surface of the third hard mask layer.

2. The method of claim 1 and further comprising selectively etching the third hard mask layer, the second hard mask layer, and the first hard mask layer to form a number of mask openings, each mask opening exposing an uncovered region on the top surface of the isolation layer.

3. The method of claim 2 and further comprising:
    forming a third patterned photoresist layer that touches and lies over the third hard mask layer and the fourth hard mask layer; and
    forming a fourth patterned photoresist layer that touches and lies over the third hard mask layer and the fourth hard mask layer, the third patterned photoresist layer and the fourth patterned photoresist layer exposing a number of uncovered regions on the top surface of the third hard mask layer, the number of uncovered regions on the top surface of the third hard mask layer being etched to form the number of mask openings.

4. The method of claim 2 and further comprising etching each uncovered region on the top surface of the isolation layer to form a number of metal contact openings, a first metal contact opening exposing the source structure, a second metal contact opening exposing the drain structure.

5. The method of claim 4 wherein the first hard mask layer and the second hard mask layer have different material compositions.

6. The method of claim 4 wherein each mask opening through the second hard mask layer has tapered side walls so that a width of a mask opening at the top surface of the second hard mask is substantially greater than a width of the mask opening at the bottom surface of the second hard mask layer.

7. The method of claim 4 wherein each mask opening through the second hard mask layer has tapered side walls so that a width of a mask opening at the top surface of the second hard mask is more than twice a width of the mask opening at the bottom surface of the second hard mask.

8. The method of claim 4 wherein the third and fourth hard mask layers are completely removed while the first hard mask layer is etched.

9. The method of claim 4 wherein the second hard mask layer and the third hard mask layer have different material compositions.

10. A method of forming a semiconductor structure comprising:
    forming a first hard mask layer that touches and lies over an isolation layer, the isolation layer having a top surface, and touching and lying over a source structure and a drain structure;
    forming a second hard mask layer that touches and lies over the first hard mask layer, the second hard mask structure having a top surface and a bottom surface;
    forming a third hard mask layer that touches and lies over the second hard mask layer, the third hard mask layer having a top surface;
    forming a fourth hard mask layer that touches and lies over the third hard mask layer, the fourth hard mask layer having a top surface;
    forming a first patterned photoresist layer that touches and lies over the fourth hard mask layer; and
    after forming the first pattern photoresist layer, forming a second patterned photoresist layer that touches and lies over the fourth hard mask layer, the first patterned photoresist layer and the second patterned photoresist layer exposing a number of uncovered regions on the top surface of the fourth hard mask layer.

11. The method of claim 10 and further comprising etching the number of uncovered regions on the top surface of the fourth hard mask layer to form a number of trenches that extend through the fourth hard mask layer, each trench exposing the third hard mask layer.

12. The method of claim 11 and further comprising:
    after etching the number of uncovered regions to expose the third hard mask layer, forming a third patterned photoresist layer that touches and lies over the third hard mask layer and the fourth hard mask layer; and
    after forming the third patterned photoresist layer, forming a fourth patterned photoresist layer that touches and lies over the third hard mask layer and the fourth hard mask layer, the third patterned photoresist layer and the fourth patterned photoresist layer exposing a number of uncovered regions on the top surface of the third hard mask layer.

13. The method of claim 12 and further comprising etching the third hard mask layer through the number of uncovered regions on the top surface of the third hard mask layer, underlying regions of the second hard mask layer, and underlying regions of the first hard mask layer to form a number of mask openings, the mask openings exposing a number of uncovered regions on the top surface of the isolation layer.

14. The method of claim 13 and further comprising etching the isolation layer through the number of uncovered regions on the top surface of the isolation layer to form a number of metal contact openings, a first metal contact opening exposing the source structure, a second metal contact opening exposing the drain structure.

15. The method of claim 14 wherein the third patterned photoresist layer has a plurality of spaced-apart strips that each lie substantially orthogonal to the trenches.

16. The method of claim 14 wherein the first hard mask layer and the second hard mask layer have different material compositions.

17. The method of claim 14 wherein each mask opening through the second hard mask layer has tapered side walls so that a width of a mask opening at the top surface of the second hard mask is substantially greater than a width of the mask opening at the bottom surface of the second hard mask.

18. The method of claim 14 wherein the third and fourth hard mask layers are completely removed while the first hard mask layer is etched.

19. The method of claim 14 wherein the second hard mask layer and the third hard mask layer have different material compositions.

20. A method of forming a semiconductor structure comprising:
- forming a first hard mask layer that touches and lies over an isolation layer that in turn touches and lies over a source structure and a drain structure;
- forming a second hard mask layer that touches and lies over the first hard mask layer, wherein the second hard mask layer is thicker than the first hard mask layer;
- forming a third hard mask layer that touches and lies over the second hard mask layer;
- forming a fourth hard mask layer that touches and lies over the third hard mask layer, wherein the first hard mask layer is thicker than a combined thickness of the third hard mask layer and the fourth hard mask layer;
- forming a first photoresist pattern over the fourth hard mask layer by:
  - depositing a first photoresist layer, imaging the first photoresist layer, and removing imaged photoresist regions of the first photoresist layer; and
  - then, depositing a second photoresist layer, imaging the second photoresist layer, and removing imaged photoresist regions of the second photoresist layer;
- etching the fourth hard mask layer using the first photoresist pattern to form a number of trenches, each trench exposing the third hard mask layer;
- forming a second photoresist pattern over the fourth hard mask layer and exposed regions of the third hard mask layer by:
  - depositing a third photoresist layer, imaging the third photoresist layer, and removing imaged photoresist regions of the third photoresist layer; and
  - then, depositing a fourth photoresist layer, imaging the fourth photoresist layer, and removing imaged photoresist regions of the fourth photoresist layer;
- selectively etching the third hard mask layer with respect to the fourth hard mask layer using the second photoresist pattern to exposed a number of uncovered regions of the second hard mask layer;
- selectively etching the second hard mask layer such that more of the second hard mask layer is removed than the fourth hard mask layer and the third hard mask layer, wherein a number of uncovered regions of the first hard mask layer are exposed and wherein a heavy polymer etch is utilized to created tapered sidewalls on the second hard mask layer;
- selectively etching the first hard mask layer with respect to the second hard mask layer to exposed a number of uncovered regions of the isolation layer; and
- etching the isolation layer using the first hard mask layer to expose the source structure and the drain structure.

* * * * *